United States Patent [19]
Cleeves

[11] Patent Number: 6,004,874
[45] Date of Patent: Dec. 21, 1999

[54] METHOD FOR FORMING AN INTERCONNECT

[75] Inventor: James M. Cleeves, Redwood City, Calif.

[73] Assignee: Cypress Semiconductor Corporation, San Jose, Calif.

[21] Appl. No.: 08/672,050

[22] Filed: Jun. 26, 1996

[51] Int. Cl.⁶ .............................. H01L 21/28; H01L 21/31
[52] U.S. Cl. ...................... 438/622; 438/625; 438/628; 438/631; 438/634; 438/645; 438/672
[58] Field of Search ..................... 438/622, 625, 438/627, 628, 629, 634, 637, 642, 643, 644, 648, 652, 653, 654, 656, 666, 669, 671, 672; 257/751, 752, 753, 763, 764

[56] References Cited

U.S. PATENT DOCUMENTS

| | | | |
|---|---|---|---|
| 4,410,622 | 10/1983 | Dalal et al. | 430/312 |
| 4,536,951 | 8/1985 | Rhodes et al. | 438/623 |
| 4,624,864 | 11/1986 | Hartmann | 438/642 |
| 4,711,701 | 12/1987 | McLevige | 438/183 |
| 4,824,521 | 4/1989 | Kulkarni et al. | 438/625 |
| 4,866,008 | 9/1989 | Brighton et al. | 438/622 |
| 4,892,835 | 1/1990 | Rabinzohn et al. | 438/184 |
| 4,914,056 | 4/1990 | Okumura | 438/629 |
| 4,917,759 | 4/1990 | Fisher et al. | 438/625 |
| 4,954,423 | 9/1990 | McMann et al. | 430/316 |
| 4,996,133 | 2/1991 | Brighton et al. | 430/313 |
| 5,065,208 | 11/1991 | Shah et al. | 257/587 |
| 5,166,771 | 11/1992 | Godinho et al. | 257/368 |
| 5,219,784 | 6/1993 | Solheim | 438/586 |
| 5,258,096 | 11/1993 | Sandhu et al. | 438/621 |
| 5,385,634 | 1/1995 | Butler et al. | 438/655 |
| 5,436,199 | 7/1995 | Brighton | 438/626 |
| 5,514,622 | 5/1996 | Bornstein et al. | 438/628 |

FOREIGN PATENT DOCUMENTS 0 242 893  10/1987  European Pat. Off. .
0 303 061  2/1989  European Pat. Off. .

OTHER PUBLICATIONS

Lee, et al., "A Process Technology For 1 Giga–Bit Dram", IEDM Tech. Dig, Dec. 1995, pp. 907–910.

Primary Examiner—T. N. Quach
Attorney, Agent, or Firm—Oblon, Spivak, McClelland, Maier & Neustadt, P.C.

[57] ABSTRACT

The present invention describes a method for forming an interconnect to a region of an electronic device. The method comprises the steps of: forming a conductive material layer, wherein the conductive material layer fills an opening in a first dielectric layer and is disposed over the first dielectric layer; applying a patterning layer over the conductive material layer, wherein the patterning layer exposes a portion of the conductive material layer; etching the conductive material layer to remove the portion of the conductive material layer in order to provide an exposed conductive material structure that protrudes above the dielectric layer; forming a second dielectric layer; and planarizing the second dielectric layer to expose a portion of the exposed conductive material structure.

8 Claims, 14 Drawing Sheets

METHOD FOR FORMING AN INTERCONNECT

BACKGROUND OF THE INVENTION

1. Field of the Invention

The present invention relates to a semiconductor manufacturing method, and more particularly to a method for forming an interconnect that serves as a contact between regions of an electronic device.

2. Description of the Background

During the semiconductor fabrication process, multiple conductive layers such as metal or polysilicon layers are often deposited on a semiconductor substrate. Conductive layers are sometimes separated from each other by an insulating dielectric layer, such as silicon dioxide. These conductive layers are often selectively connected or "wired" together in order to allow for conduction of electricity in a desired pattern.

FIGS. 1A–FIG. 1J illustrate a method of making a connection between different conductive layers of a semiconductor substrate.

In FIG. 1A, a dielectric oxide layer 104 is shown deposited on top of a patterned local interconnect ("LI") 102. LI 102 may be a metal (e.g. titanium tungsten (TiW)) or a polysilicon gate member or other conductive material, such as a silicide, or doped polysilicon.

In FIG. 1B, the dielectric oxide layer 104 is polished.

In FIG. 1C, a contact or a via 106 through the dielectric oxide 104 is created by a suitable technique such as with a mask and etching, ending at the patterned LI 102.

As illustrated in FIG. 1D, the next step is to deposit an adhesive layer 108 over the dielectric oxide 104 and into the opening 106, without completely filling the opening 106. An adhesive layer helps an overlying conductive layer adhere to dielectric oxide layer 104 and may itself be formed of a conductive material such as titanium.

A conductive material, such as tungsten (W) 110, is then deposited as a conductive layer on top of the adhesive layer 108 until the opening 106 is filled as illustrated in FIG. 1E. There may be a small depression in the conductive material layer 110 (not shown) over the opening 106.

In FIG. 1F, an etch back is performed on the conductive 110 layer but the etch is stopped at the adhesive layer 108. Thus, a portion of the surface of the conductive layer is exposed as shown in FIG. 1F.

As illustrated in FIGS. 1G and 1H, a layer of a photoresist 114 is deposited covering adhesive layer 108 and onto the exposed portion of conductor 110. A mask 112 is used to pattern a local interconnect ("LI") 116 by etching the adhesive layer 108. The LI 116 has been formed by adhesive layer 108 and stripping photoresist 114.

FIG. 1I illustrates a dielectric oxide layer 118 which has been deposited over dielectric oxide 104 and a contact formed such as by a mask and etch of dielectric oxide 118. The result is an opening 120 formed in the dielectric oxide layer 118.

The previous steps are repeated as shown in FIG. 1J, when an adhesive layer 122 such as titanium is deposited over dielectric oxide layer 118 and a blanket layer of conductive material 124 is deposited on top of the adhesive layer 122. The conductive material 124 is then etched back so that only a portion of the conductive material 124 is shown in the opening. The etch of the conductive material 124 stops at the adhesive layer 122. In this way, LI 102 is connected to a LI 116 and to adhesive layer 122.

This method has several disadvantages. The contact surface of opening 120 in FIG. 1I is often compromised due to insufficient cleaning of the bottom of the contact opening 120. In addition, when LI 116 is made of a material having a low melting point (e.g. titanium), it is difficult to heat treat the bottom of the contact opening 120 to remove contaminants without causing LI 116 to reflow. Difficulties in getting adhesive layer 122 to the bottom of the opening 120 can also occur, especially when an opening has a high aspect ratio. This method is labor-intensive (i.e., two conductive material depositions and two etch-backs), thus increasing the possibility of error or contamination from the increased complexity of processing.

Thus, a need exists for a relatively simple process for making reliable connections between conductive material layers and/or local interconnects of a semiconductor substrate.

SUMMARY OF THE INVENTION

The present invention provides a method of forming an interconnect, such as a contact, metal post or via to a region of an electronic device and a semiconductor comprising such an interconnect.

According to one embodiment of the present invention, is a method for forming an interconnect comprising:

(a) etching a conductive material layer patterned with a photoresist, to remove a portion of said conductive material structure and provide an exposed conductive material structure that protrudes above a first insulating layer;

(b) forming a second insulating layer over said first insulating layer and said exposed conductive material structure, preferably sufficient to cover said first insulating layer and said exposed conductive material structure; and (c) planarizing said second insulating layer to expose a portion of said exposed conductive material structure.

According to another embodiment of the present invention is a semiconductor device comprising an interconnect to a semiconductor region comprising:

a semiconductor substrate having a semiconductor region;

a first dielectric layer overlying said semiconductor substrate;

a second dielectric layer overlying said first dielectric layer;

an opening extending through said first and second dielectric layer to said semiconductor region;

an etch stop layer; and a conductive material structure, wherein said etch stop layer and said conductive material structure substantially fills said opening; and there is an axis normal to said semiconductor substrate which passes through said etch stop layer but does not pass through said conductive material structure.

Another embodiment of the invention, concerns a method for forming an interconnect comprising:

(a) forming a first conducting layer over a semiconductor substrate;

(b) forming a second conducting layer over said first conducting layer;

(c) forming a third layer of a photoresist over said second conducting layer;

(d) etching said second conducting layer to form a first conductive structure;

(e) etching said first conducting layer to form a second conductive structure;

(f) forming a first insulating layer over said semiconductor substrate, said first conductive structure and said second conductive structure; and (g) planarizing said first insulating layer to expose a surface of said second conducting layer.

According to another embodiment of the present invention is a semiconductor device comprising an interconnect to a semiconductor region comprising:

a semiconductor substrate having a semiconductor region;

a first dielectric layer overlying said semiconductor substrate;

an opening extending through said first dielectric layer to said semiconductor region;

a first conductive material structure; and a second conductive material structure, wherein said first conductive material structure and said second conductive material structure substantially fills said opening; and there is an axis normal to said semiconductor substrate which passes through said second conductive material structure but does not pass through said first conductive material structure.

BRIEF DESCRIPTION OF THE DRAWINGS

The present invention will be understood more fully from the detailed description given below and from the accompanying drawings and various embodiments of the invention, which should not be taken to limit the invention to the specific embodiments, but are provided to help explain the invention and provide the reader with a better understanding of the same.

DETAILED DESCRIPTION OF THE PREFERRED EMBODIMENTS

A method for forming an interconnect between regions of an electronic device using conductive materials in structures, such as a contact, a metal post or a via, is described. In the following description, numerous details are set forth, such as the use of photoresist or the use of a self-aligned contact etch. It will be apparent, however, to one skilled in the art, that the present invention may be practiced other than as specifically described herein. In other instances, well-known structures and processes have not been set forth in detail in order to avoid obscuring the present invention.

Figure 2:
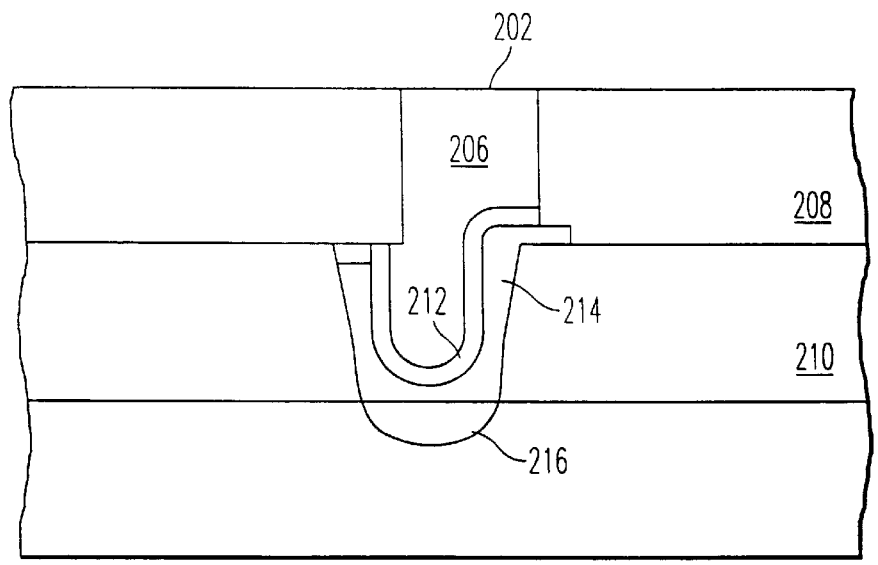
FIG. 2 illustrates a conductive material post that is formed according to a first embodiment of the present invention.

FIG. 2 illustrates a conductive material post that was formed according to one embodiment of the present invention.

The top surface 202 of a conductive material post 206 (which may comprise, e.g., titanium, zirconium, hafnium, chromium, molybdenum, tungsten, alloys thereof such as titanium-tungsten, polysilicon, etc.) is exposed after an oxide polish or oxide etch step. The conductive material is preferably tungsten. The conductive material post 206 is shown surrounded by dielectric layers 208 and 210 (for example silicon dioxide, silicon nitride, oxide/nitride/oxide or $SiO_xN_y$). The conductive material post 206 makes contact to a substrate region 216 of an electronic device, such as a source or drain region of a MOS transistor, a gate material of a gate electrode, a conductive region of a local interconnect or a conductive material. The conductive material post 206 may be aligned with the substrate region 216; however, conductive material post 206 does not necessarily have to be completely aligned with the substrate region 216 to which contact is made.

In addition, an etch stop layer 214 (e.g. metals such as titanium, zirconium, hafnium, chromium, molybdenum, tungsten, alloys thereof such as titanium-tungsten; oxides, nitrides and oxynitrides of such metals or of Si, such as silicon dioxide, silicon nitride, silicon oxynitride, and silicides such as $WSi_x$ and $TiSi_x$) primarily prevents etchants from etching underlying layer of materials but may also form a local interconnect as well as provides an adhesive interface between the conductive material and the dielectric layer. An adhesive or glue layer 212 (e.g titanium, zirconium, hafnium, chromium, molybdenum, tungsten, alloys thereof such as titanium-tungsten) may also be provided which assists adherence of an overlying etch stop and/or conductive material layer (e.g. metal such as tungsten or doped polysilicon) to an adjacent dielectric layer (e.g. an oxide, nitride or other dielectric). The upper portion of the conductive material post 206 is not necessarily surrounded by an adhesive layer, but rather, may be surrounded by an insulating dielectric layer 208. The etch stop and/or the adhesive layer may also be made of a conductive material.

FIGS. 3A—3L illustrate one method for practicing the present invention.

Figure 3A:
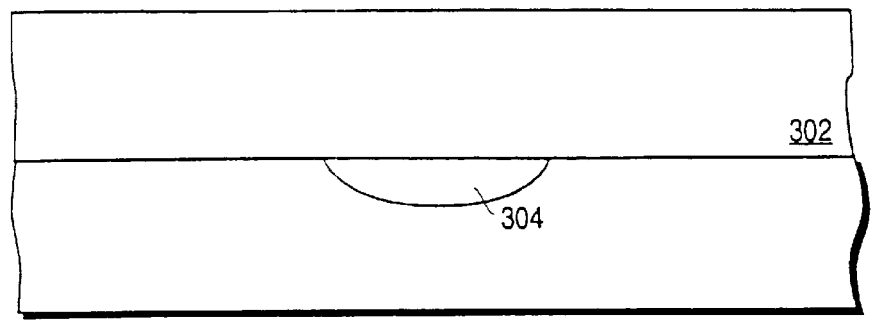
FIGS. 3A–3L illustrate steps for forming an interconnect according to a first embodiment of the present invention.

FIG. 3A illustrates a dielectric layer 302 that has been deposited by a technique conventionally known to those of ordinary skill in the art for example by atmospheric pressure Chemical Vapor Deposition (APCVD), low pressure Chemical Vapor Deposition (LPCVD), plasma-enhance Chemical Vapor Deposition (EPCVD), sputtering or thermally grown. The thickness of dielectric layer 302 is not particularly limited but preferably is in the range of about 0.3–3 μm, more preferably 0.5–1 μm.

Figure 3B:
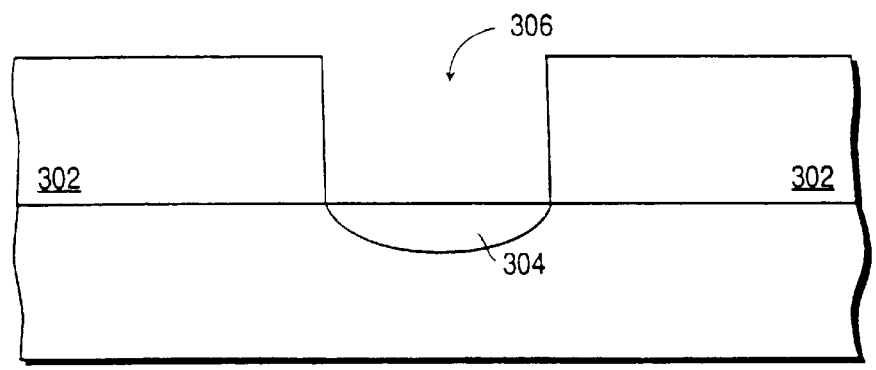

Dielectric layer 302 overlies a substrate region 304 to which contact will be made. The substrate region 304 is typically either a source or a drain region of a semiconductor substrate, a gate material of a gate electrode, a contact for a local interconnect or a conductive material. In FIG. 3B, an opening 306 through dielectric layer 302 to substrate region 304 to which contact will be made, is made by conventional methods known to those of ordinary skill in the art such as by a self-aligned contact etch to form an opening. A non self-aligned mask may also be used.

Figure 3C:
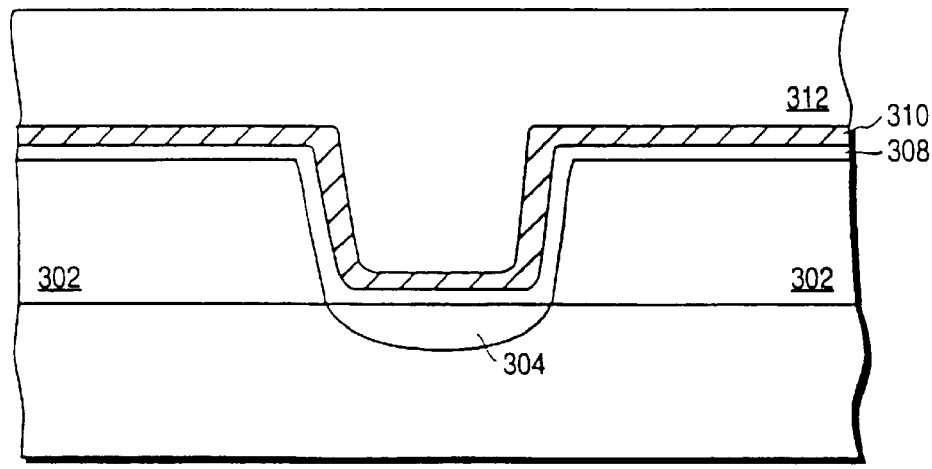

As illustrated in FIG. 3C, an etch stop layer 308 (e.g., titanium, zirconium, hafnium, chromium, molybdenum, tungsten, alloys thereof such as titanium-tungsten alloy, etc.) is deposited over the dielectric layer 302 and into the opening 306, without completely filling the opening 306. The thickness of the etch stop layer is not particularly limited and generally ranges from 50–2,500 Å, preferably 70–2,000 Å, more preferably 100–1,500 Å. When the etch stop layer 308 is titanium, a thickness is preferably in the range of about 100–2,000 Å, preferably 100–1,500 Å, more preferably 120–1,200 Å. It is noted that conductors or metals may be used as an etch stop layer besides titanium, titanium tungsten alloy or Cr in the present invention, provided that the etch stop layer is sufficiently resistant to etching under the selected etching conditions to allow for selectively etching the conductive material layer 312 at a greater rate relative to the rate of etching of the dielectric layer 302. As the etch stop material it is also possible to use nitrides such as silicon nitride, especially when the conductive material layer is tungsten.

As illustrated in FIG. 3C, adhesive layer 310 (e.g. titanium, zirconium, hafnium, chromium, molybdenum, tungsten, copper, silver, gold, platinum, alloys thereof such as titanium-tungsten alloy, etc.) is optionally deposited over the etch stop layer 308 and into the opening 306, without completely filling the opening 306. The thickness of the adhesive layer is not particularly limited and generally ranges from 50–2,500 Å. When the adhesive layer 310 is titanium tungsten, a thickness is preferably in the range of approximately 400–1,500 Å.

In addition, a stuffing step may be used after the etch stop layer 308 and optional adhesive layer 310 have been deposited. This stuffing step is a heat treatment to get better contact resistance and better resistance to the conductive material deposition.

In addition, it is possible to reverse the order of the etch stop and adhesive layers.

Next, a layer of conductive material 312 is deposited that substantially fills the contact opening 306. The thickness of the conductive material layer may vary depending on the desired height of the conductive material post, but is preferably of a thickness of about 0.4–4.0 $\mu$m, preferably 0.5–3.0 $\mu$m, more preferably 0.7–2.5 $\mu$m. Non-limiting examples of conductive materials are titanium, zirconium, hafnium, chromium, molybdenum, tungsten, alloys thereof such as titanium-tungsten alloy etc. aluminum and polysilicon. Preferably the conductive material layer is tungsten. The present invention may advantageously deposit one conductive material layer. Thus, the present invention provides a more streamlined and cost-efficient method for forming a conductive material post.

Figure 3D:
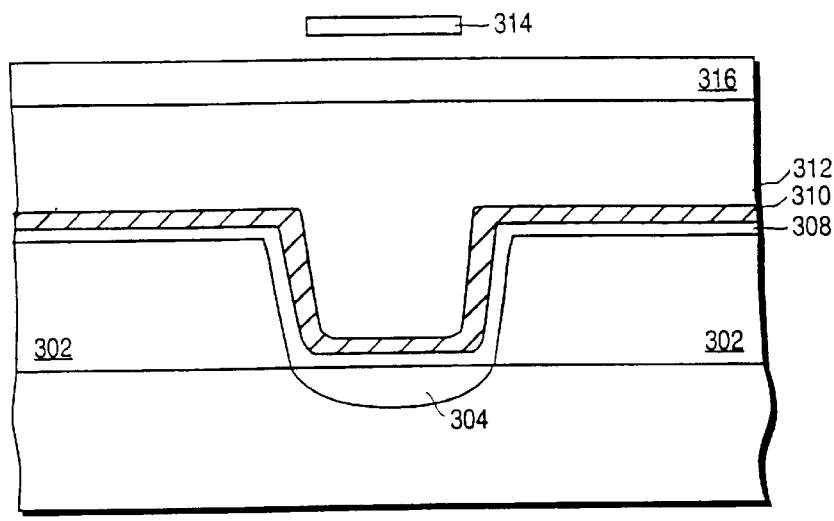

As shown in FIG. 3D, a metal contact mask 314 is used to pattern a layer of deposited photoresist 316. A reverse metal contact mask and positive photoresist system is illustrated in FIG. D, however those of ordinary skill in the art will appreciate that masking can be accomplished with a metal contact mask and negative photoresist system. Exemplary positive and negative photoresist systems are described later in this application. It is to be appreciated that other conventional techniques may be used to pattern the photoresist or to etch the conductive material 312. The photoresist 316 is developed by conventional methods know to those of ordinary skill in the art.

Figure 3E:
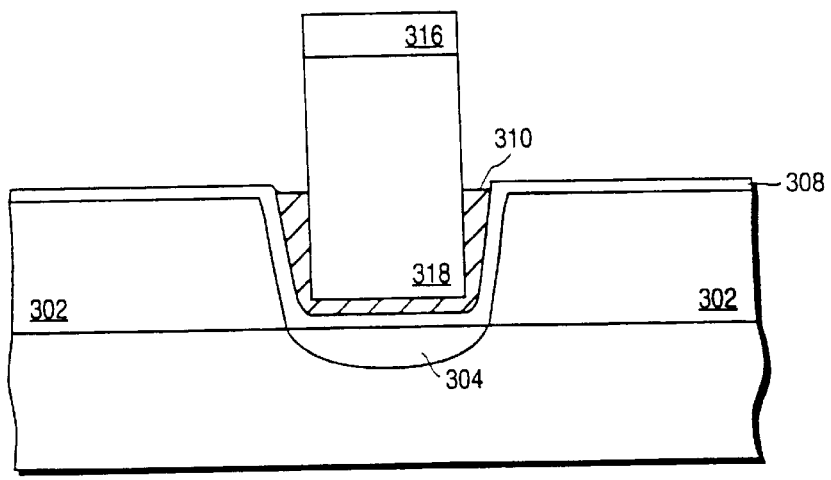

Selective etching of the exposed conductive material 312, stopping at the etch stop layer 308 may be conducted with an etchant such as $SF_6$, $Cl_2$, $C_nH_xF_y$ (where y≧1, and x+y=2n+2), HF, HCl or $CCl_4$. The conductive material 312 is preferably anisotropically etched as illustrated in FIG. 3E.

In a preferred embodiment, there is control of lateral etching during formation of the conductive material post 318. Control of lateral etching may be obtained by conventionally maintaining a low wafer electrode temperature of about 10° C. and by introducing $N_2$ gas or a polymer forming gas, such as $CHF_3$, into the etch chamber for sidewall passivation. The protocol of this preferred embodiment results in a conductive material post 318 with a layer of photoresist 316 on top of it. Another advantage of the present invention is that it only requires one conductive material etch, unlike other methods which required two etches. This reduces the possibility of contamination and defects due to contamination during the etching process.

When present, on or above the etch stop layer, adhesive layer 310 may also be etched, either during the etch of the conductive material or in a separate etch step.

Figure 3F:
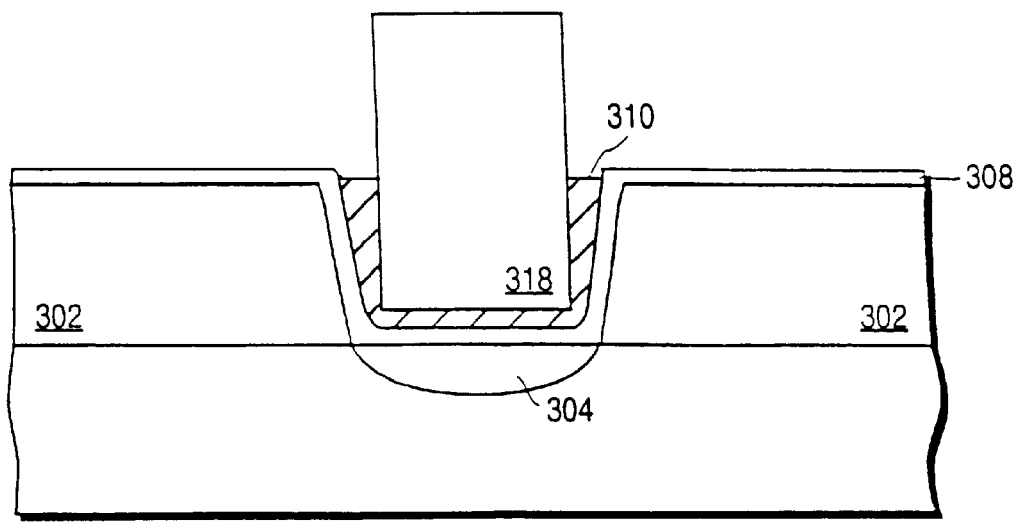

The photoresist 316 is stripped and a conductive material post 318 is shown protruding above etch stop layer 308, adhesive layer 310 and dielectric layer 302 as shown in FIG. 3F.

In a preferred embodiment, etch stop layer 308 may be patterned into a local interconnect. The local interconnect is formed such that there is an axis normal to said semiconductor substrate which passes through said etch stop layer but does not pass through said conductive material structure. When made of a conductive material, such a local interconnect may serve to electrically connect a second contact or via to an additional metal line. It is sometimes desirable to provide multiple points of electrical connection to a substrate region, such as when two or more parallel planes of perpendicular metal lines are used to provide a conductive network across a plane of an integrated circuit.

Figure 3G:
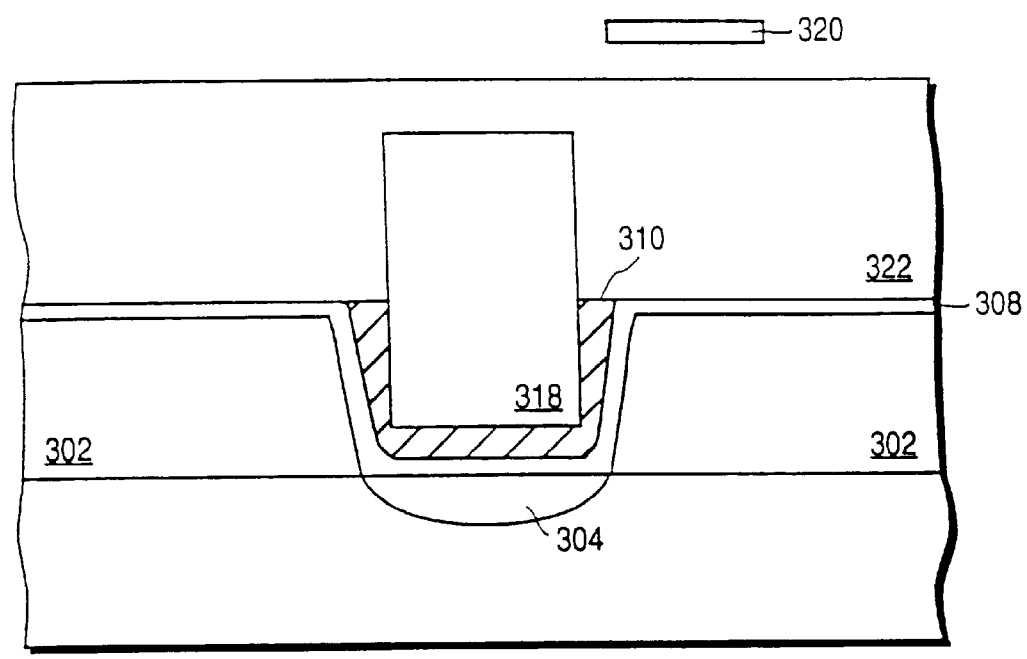

As shown in FIG. 3G, a layer of photoresist 322 is deposited around the conductive material post 318. A local interconnect mask 320 is used to pattern a photoresist 322 and etch stop layer 308. It is to be appreciated that the local interconnect may be formed using other conventional techniques.

Figure 3H:
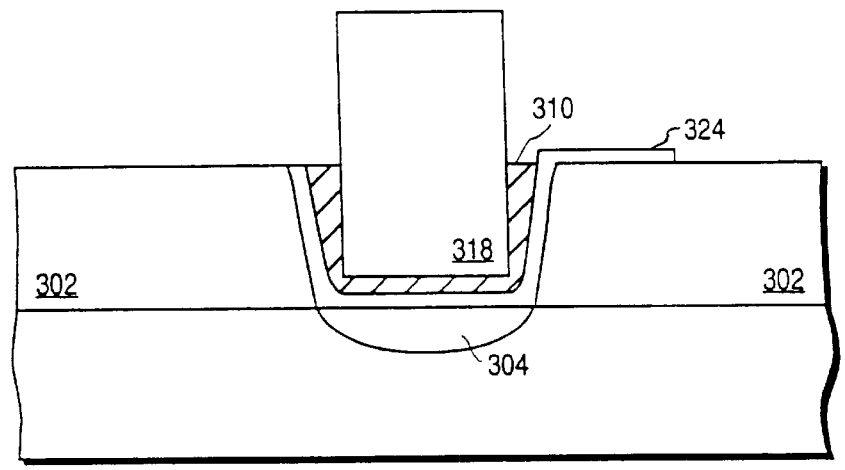

In FIG. 3H, the photoresist 322 is developed and a local interconnect ("LI") 324 is etched and formed from the adhesive layer 308 of FIG. 3G. The remaining photoresist 322 is then stripped.

Figure 3I:
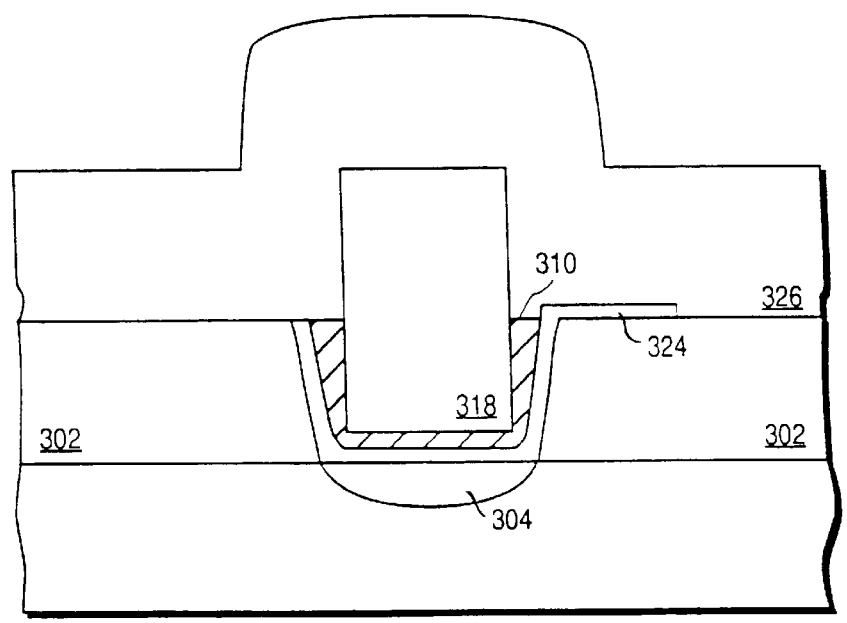
Figure 3J:
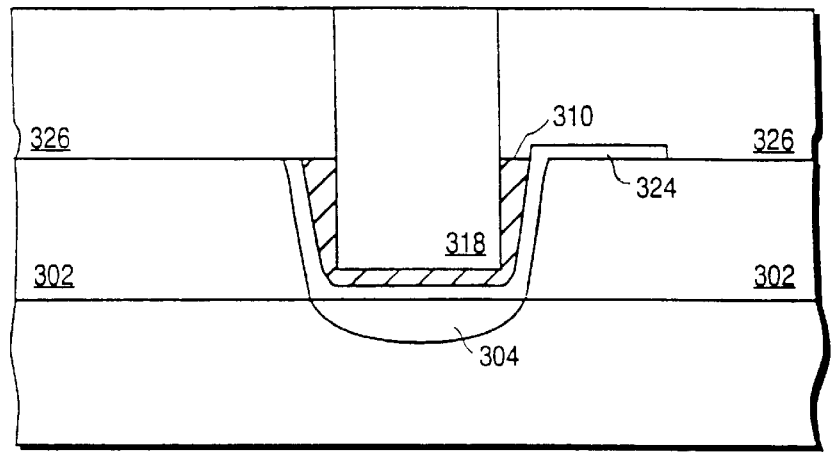
Figure 3K:
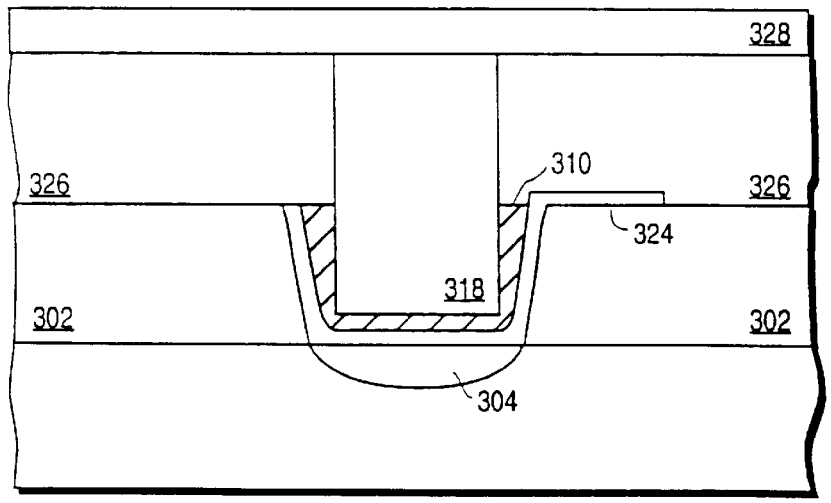
Figure 3L:
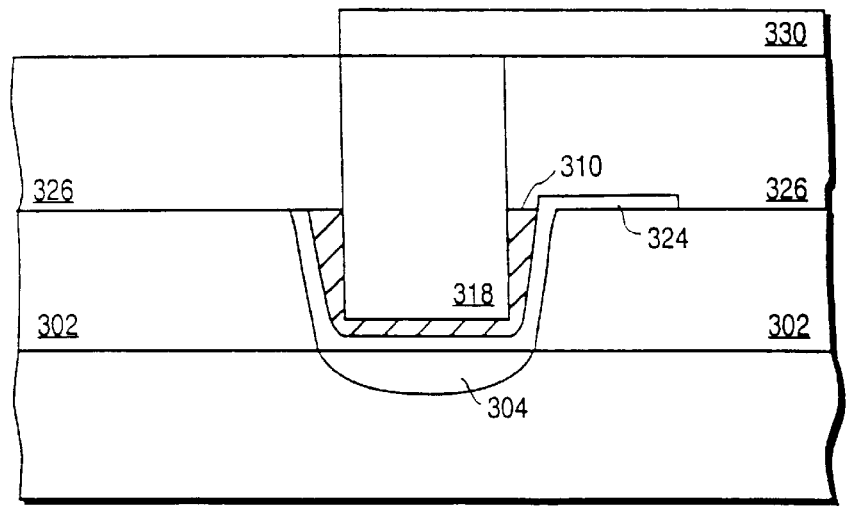

As illustrated in FIG. 3I, a layer of dielectric 326, with a thickness approximately equal to the thickness of the conductive material layer 318, is deposited using any of the conventional techniques, such as sputtering or chemical vapor deposition. The dielectric layer 326 is polished to expose the top layer of conductive material post 318 as described in FIG. 3J. Dielectric layer 326 may be planarized utilizing techniques other than polishing. In FIG. 3K, a metallization layer of a conductor 328, such as aluminum, is deposited over the dielectric layer 326. As seen in FIG. 3L, metallization layer 328 has been patterned using a mask or any other conventional technique to form a local interconnect ("LI") 330.

Since FIG. 3L is illustrative, metallization layer 328 is not necessarily drawn to scale and in actuality, may be almost as thick as dielectric layer 326.

Figure 4:
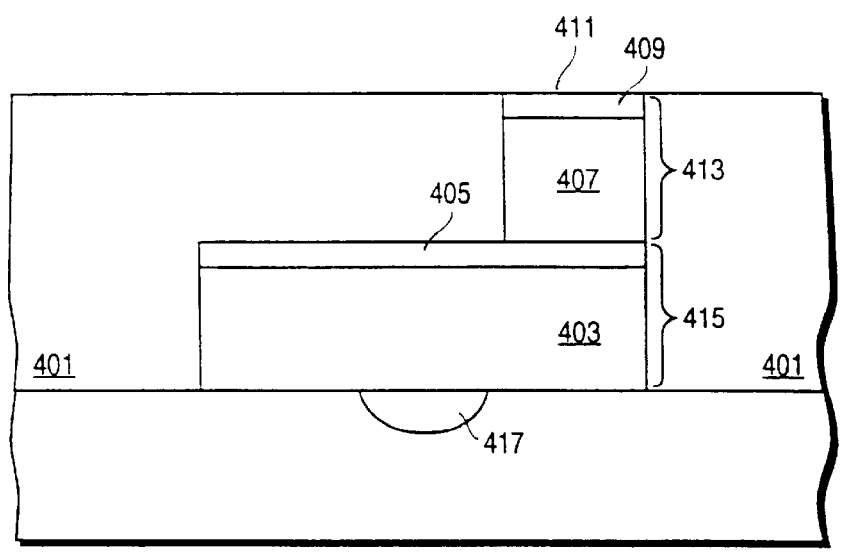
FIG. 4 illustrates an interconnect that is formed according to a second embodiment of the present invention.

FIG. 4 illustrates an interconnect that was formed according to a second embodiment of the present invention.

Contact is made to a region of substrate 417 utilizing two conductive structures. Non-limiting examples of a region include a source or a drain region of a substrate, a gate material of a gate electrode, a metallization layer or a local interconnect.

The first conductive structure is a conductive material post 413 comprising a conductive material layer 407, optionally comprising a cap 409 such as chromium. The conductive material layer 407 may preferably be a metal such as aluminum, doped polysilicon, titanium, zirconium, hafnium, chromium, molybdenum, tungsten, copper, silver, gold, platinum, conductive alloys thereof such as titanium-tungsten alloy etc., more preferably aluminum. The cap 409 may also be made of aluminum, silicon, titanium, zirconium, hafnium, chromium, molybdenum, tungsten, copper, silver, gold, platinum, conductive alloys thereof such as titanium-tungsten alloy, and is preferably a titanium tungsten alloy. A second conductive structure 415 is formed from, in one embodiment, a conductive material layer 403 such as aluminum, doped polysilicon, titanium, zirconium, hafnium, chromium, molybdenum, tungsten, copper, silver, gold, platinum, conductive alloys thereof such as titanium-tungsten alloy, aluminum, preferably aluminum and a etch stop layer 405 such as titanium, zirconium, hafnium, chromium, molybdenum, tungsten, alloys thereof such as titanium-tungsten alloy, preferably titanium tungsten alloy. If the cap 409 is made of titanium tungsten alloy, etch stop layer 405 may be made of chromium.

The conductive material posts 413 and 415 are surrounded by an insulating dielectric layer 401, such as silicon dioxide, silicon nitride, a conventional oxide/nitride/oxide or $Si_xN_y$. although conductive material posts 413 and 415 are shown as being aligned along one edge, they do not necessarily have to be aligned as shown in FIG. 4. The top surface 411 of cap 409 is exposed and is ready to make contact to another conductive material layer.

FIGS. 5A–5J illustrate the steps for preparing a conducting means according to a second embodiment of the present invention.

Substrate layer 501 contains a substrate region to which contact is made. Non-limiting examples of substrate regions are a source or a drain region of a substrate, a gate material of a gate electrode, a metallization layer or a local interconnect. The above-identified substrate regions are typically only a portion of the substrate layer 501, the remaining material typically being a dielectric material such as silicon dioxide, silicon nitride, a conventional oxide/nitride/oxide or $SiO_xN_y$.

Within the context of FIGS. 5A–5H, layers of conductive material 502 and 506 are illustrated. Non-limiting examples of conductive material are titanium, zirconium, hafnium, chromium, molybdenum, tungsten, alloys thereof such as titanium-tungsten alloy, polysilicon, aluminum, aluminum alloys, tungsten silicide, a silicide, a salicide, a polycide, a doped polysilicon etc. Preferably the conductive material layers 502 and 506 are aluminum.

Within the context of FIGS. 5A–5H, etch stop layer 504 is illustrated. Non-limiting examples of an etch stop layer, including chromium, titanium-tungsten alloy, and others as mentioned above. The etch stop layer 504 may provide an adhesive interface between conductive material layers 502 and 506 and acts as an etch stop during the formation of a first conductive material post. The etch stop layer 504 is most preferably sufficiently resistant to etching, under the selected etching conditions, to allow for etching of a conductive material layer 506 and optional cap layer 508 without substantially etching the conductive material layer 502. In other words, the etch stop material is etched more slowly than the overlying layer(s) being etched, preferably at a relative rate selectivity of $\geq 1:2$, more preferably $\geq 1:5$.

Within the context of FIGS. 5A–5H, adhesive layer 508 is illustrated. Non-limiting examples of adhesive layer include chromium, titanium-tungsten alloy and others as indicated above. Adhesive layer 504 in particular provides an adhesive interface between conductive material layers 502 and 506 and may act as an etch stop during the formation of a first conductive material post.

Within the context of FIGS. 5A–5H, resist layers 510, 514 and 516 are illustrated.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation of suitable negative resist materials is within the level of skill of one of ordinary skill in the art without undue experimentation. Specific non-limiting examples of suitable negative resist systems include cresol epoxy novolac-based negative resists as well as negative resists containing the photoreactive polymers described in Kirk-Othmer Encyclopedia of Chemical Technology, 3rd Edition, vol 17, entitled "Photoreactive Polymers", pages 680–708, the relevant portions of which are hereby incorporated by references.

Positive resists have photoreactive components which are destroyed in the regions exposed to light. Typically the resist is removed in an aqueous alkaline solution, where the exposed region dissolves away. The preparation of suitable positive resist materials is within the level of skill of one of ordinary skill in the art without undue experimentation. Specific non-limiting examples of suitable positive resist systems include Shipley XP9402, JSR KRK-K2G and JSR KRF-L7 positive resists as well as positive resists containing the photoreactive polymers described in Kirk-Othmer Encyclopedia of Chemical Technology, 3rd Edition, vol 17, entitled "Photoreactive Polymers", pages 680–708, the relevant portions of which are hereby incorporated by references.

Exemplary resist materials are also described by Bayer et al, IBM Tech. Discl. Bull (USA) vol 22, No 5 October 1979 pp 1855; Tabei, U.S. Pat. No. 4,613,404; Taylor et al, J. Vac. Sci, Technol. B. Vol 13, No. 6, 95 pp 3078–3081; Argitis et al, J. Vac. Sci, Technol. B. Vol 13, No. 6, 95 pp 3030–3034; Itani et al, J. Vac. Sci, Technol. B. Vol 13, No. 6, 95 pp 3026–3029; Ohfuji et al, J. Vac. Sci, Technol. B. Vol 13, No. 6, 95 pp 3022–3025; Trichkov et al, J. Vac. Sci, Technol. B. Vol 13, No. 6, 95 pp 2986–2993; Capodieci et al, J. Vac. Sci, Technol. B. Vol 13, No. 6, 95 pp 2963–2967; Zuniga et al, J. Vac. Sci, Technol. B. Vol 13, No. 6, 95 pp 2957–2962; Xiao et al, J. Vac. Sci, Technol. B. Vol 13, No. 6, 95 pp 2897–2903; Tan et al J. Vac. Sci, Technol. B. Vol 13, No. 6, 95 pp 2539–2544; and Mayone et al J. Vac. Sci, Technol. Vol 12, No. 6, pp 1382–1382. The relevant portions of the above-identified references which describe the preparation of resist materials is hereby incorporated by reference.

Within the context of FIGS. 5A–5H, a dielectric layer 522 is illustrated. Non-limiting examples of dielectric material are silicon dioxide, silicon nitride, a conventional oxide/nitride/oxide, tetraorthosilicate based oxides, titanium oxide and $SiO_xN_y$.

Within the context of the following exemplary methods, non-limiting examples of absolute dimensions have been provided, however the absolute and relative thicknesses of individual conductive material layers, etch stop layers, adhesive layers and photoresist layers may vary depending on the height of the conductive material post which is necessary.

Figure 1A:
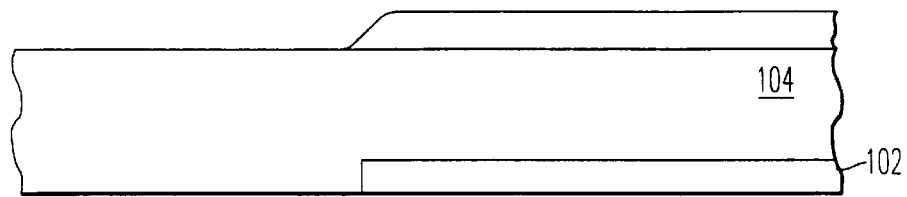
FIGS. 1A–1J illustrate a conventional method of forming a metal post.
Figure 1B:
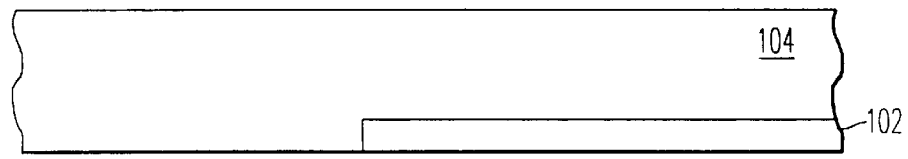
Figure 1C:
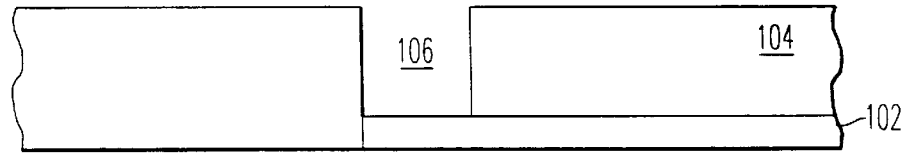
Figure 1D:
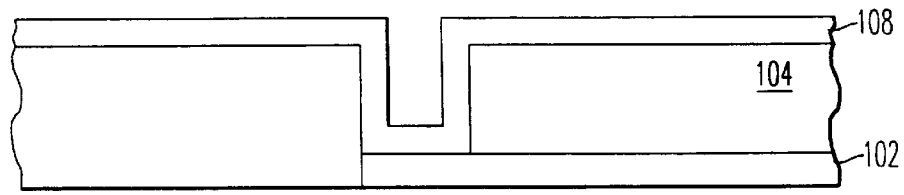
Figure 1E:
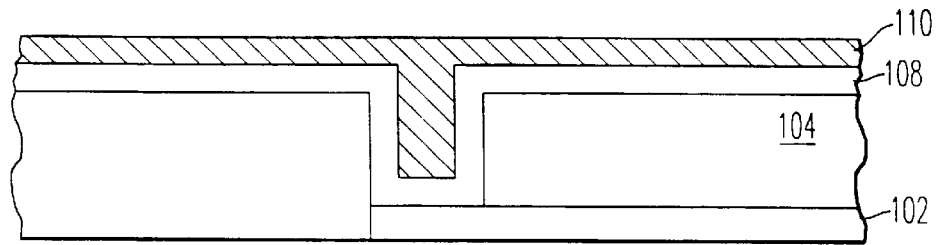
Figure 1F:
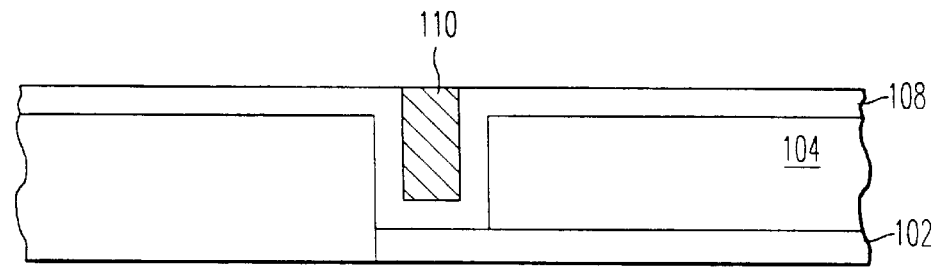
Figure 1G:
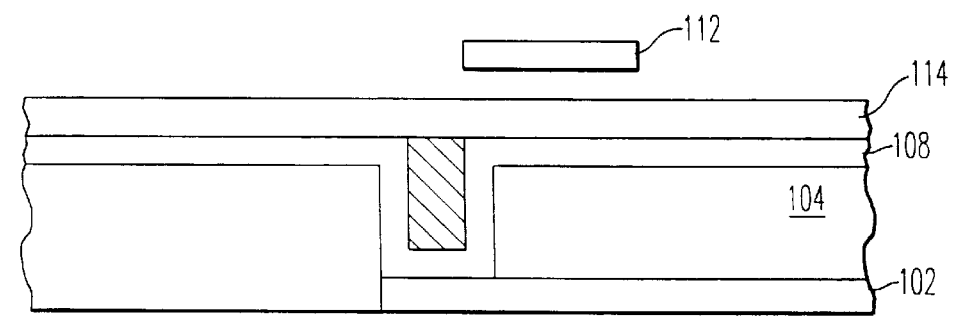
Figure 1H:
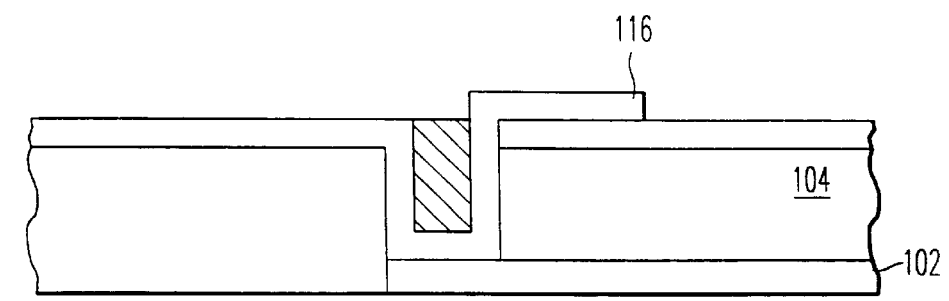
Figure 1I:
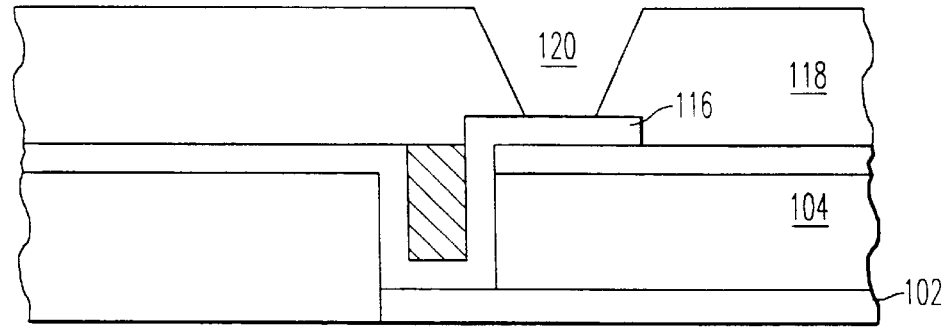
Figure 1J:
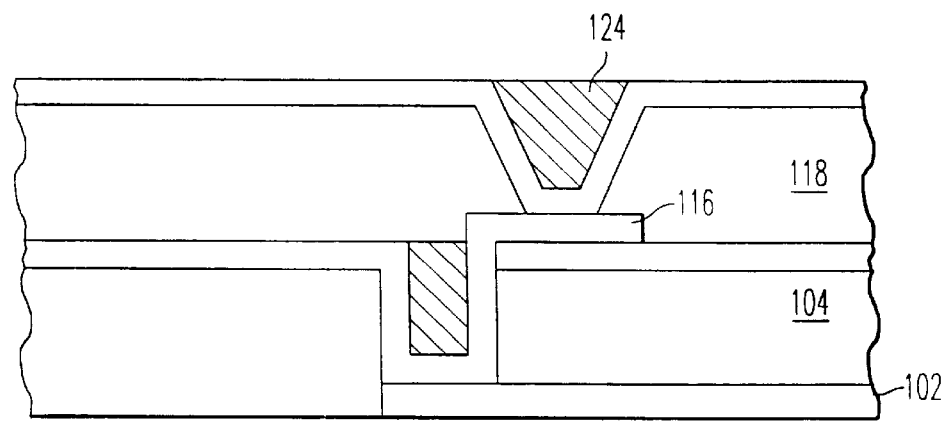
Figure 5A:
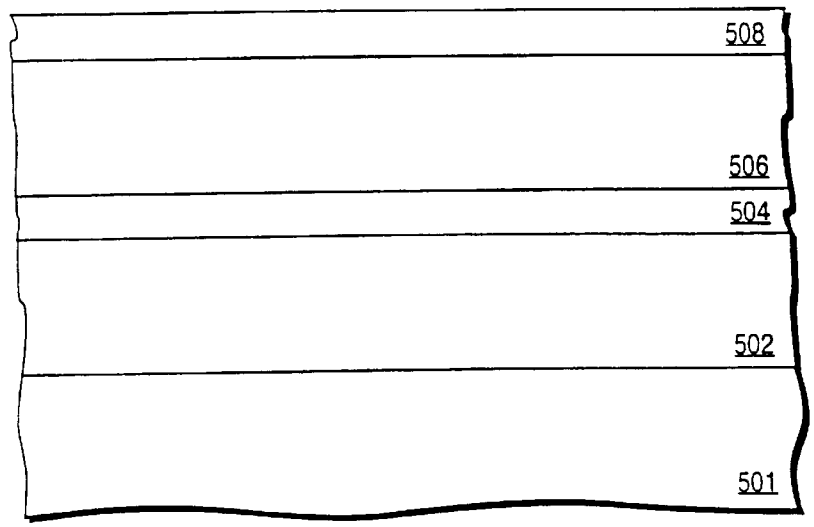
FIGS. 5A–5J illustrate steps for forming an interconnect according to a second embodiment of the present invention.

As shown in FIG. 5A, a first conductive material layer 502 such as aluminum that is about 1 $\mu$m thick in one embodiment is deposited on a substrate layer 501. In one embodiment, the substrate layer 501 may have an opening in it or, a metal line or a local interconnect under it such that it will connect the first conductive material layer 502 to another region underneath the substrate layer 501. For example, an opening in substrate layer 501 may expose an underlying interconnect such as interconnect 108 shown in FIG. 1D. The first conductive material layer 502 may be deposited such as by a sputtering. Next, an etch stop layer 504 such as of titanium tungsten alloy that is about 1,000 Å thick is deposited. Next, another layer of conductive material 506 such as aluminum that is about 1 micron thick is deposited over etch stop layer 504. Finally, adhesive layer 508 such as of titanium tungsten alloy that is about 1,500 Å thick is deposited over the conductive material layer 506.

In a preferred embodiment, the conductive material layer 502, the etch stop layer 504, the conductive material layer 506, and the adhesive layer 508 are sputter deposited in one pass through a sputter deposition processing equipment. It is to be appreciated that these layers may also be formed using other conventional techniques and that these layers may be of different conductive materials and different thicknesses without departing from the spirit and scope of the present invention.

Figure 5B:
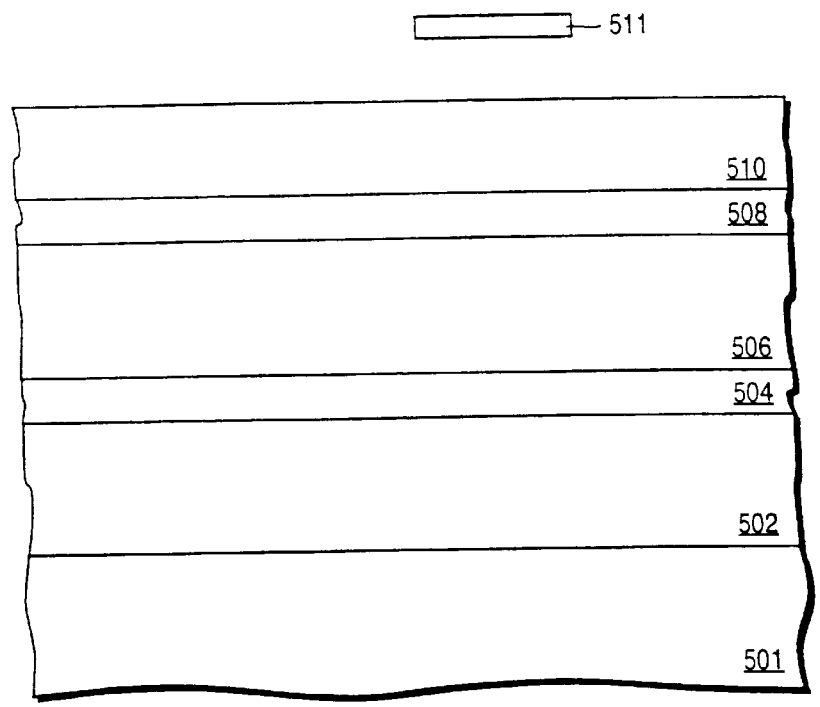
Figure 5C:
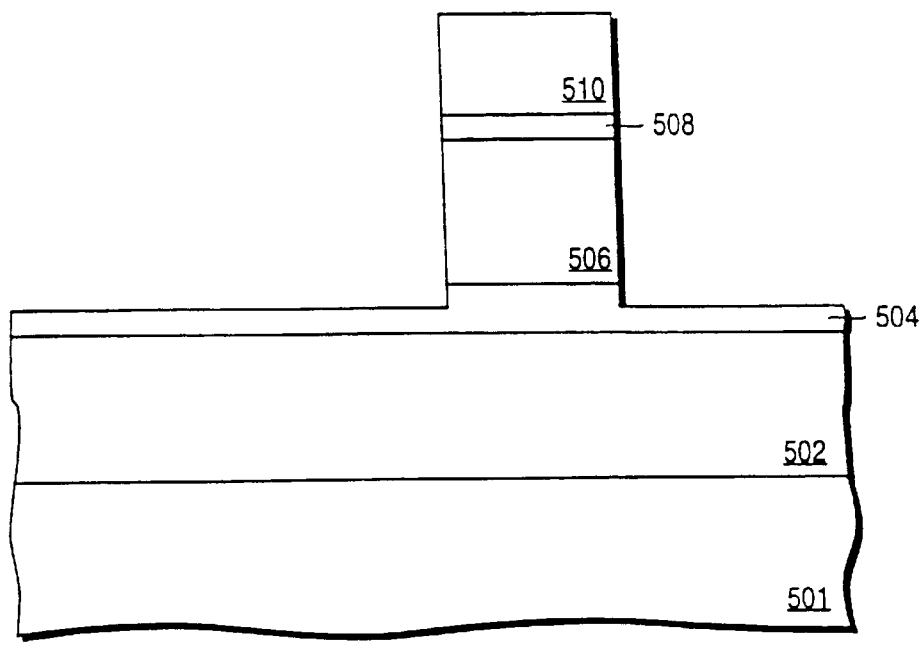

As illustrated in FIG. 5B, a layer of photoresist 510 is deposited over the top layer of adhesive layer 508. A post mask 511 is then applied and etched to form a first conductive material post. In FIG. 5C, the photoresist 510 is developed and a fluorine etch may be used to etch the top layer of adhesive layer 508, when adhesive layer 508 is chromium or titanium-tungsten alloy. Next, a chlorine etch may be used to etch conductive material (e.g., aluminum) layer 506, stopping at etch stop layer 504 when conductive material layer 506 is aluminum and etch stop layer 504 is titanium-tungsten alloy. Etch stop layer 504 and adhesive layer 508 may be thinned during the etch of conductive material layer 506. Alternatively, this or any conductive material layer may be conventionally polished, such as by chemical mechanical polishing.

It will be appreciated by those of ordinary skill in the art that the materials used for conductive material layer 506, etch stop layer 504 and optional adhesive layer 508 may be selected in accordance with the etching process used such that etching of the conductive material 506, and adhesive layer 508 when present is conducted in the substantial absence of etching of conductive layer 502, preferably in the substantial absence of etching of the etch stop layer 504.

Figure 5D:
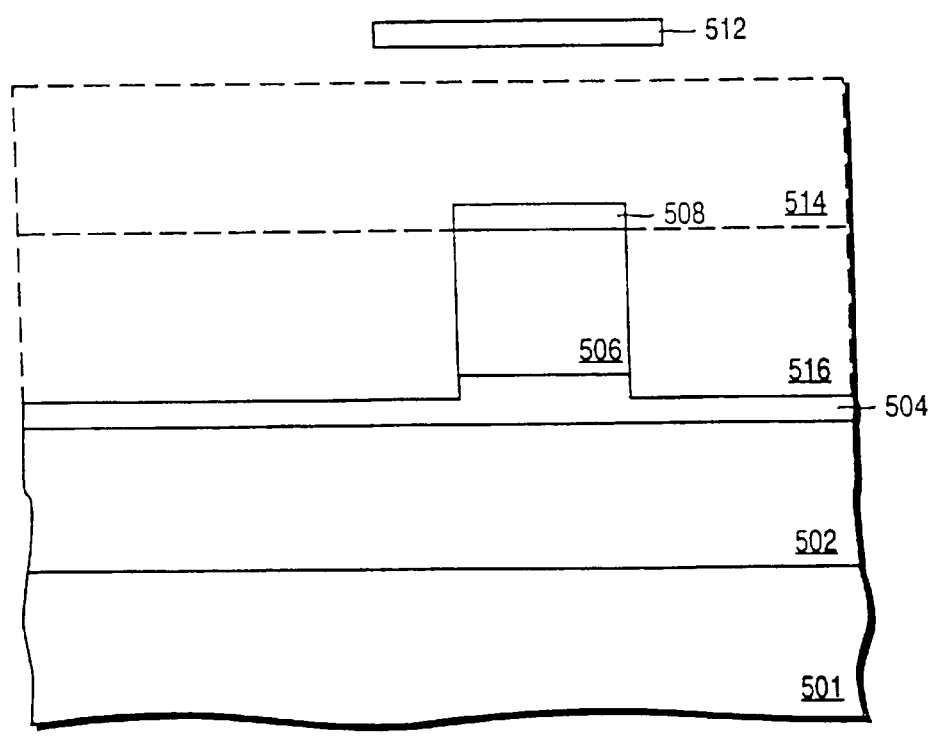

In FIG. 5D, a metal pattern resist is then applied to form a second conductive material post. Metal mask 512 is used to pattern the conductive material post. The length of metal mask 512 is preferably greater than the length of mask 511 such that an axis normal to said substrate may pass through said second conductive material post without passing through said first conductive material post. Although a mask 511 and a metal mask 512 was used, other conventional techniques may be used to pattern a conductive material post. The photoresist may be applied in two different ways. The photoresist may be applied as shown in area 516 such that the top adhesive layer 508 is exposed during the etch of etch stop layer 504 and conductive material layer 502. On the other hand, the positive photoresist may be applied so as to cover the adhesive layer 508 as shown in area 514 and area 516.

Figure 5E:
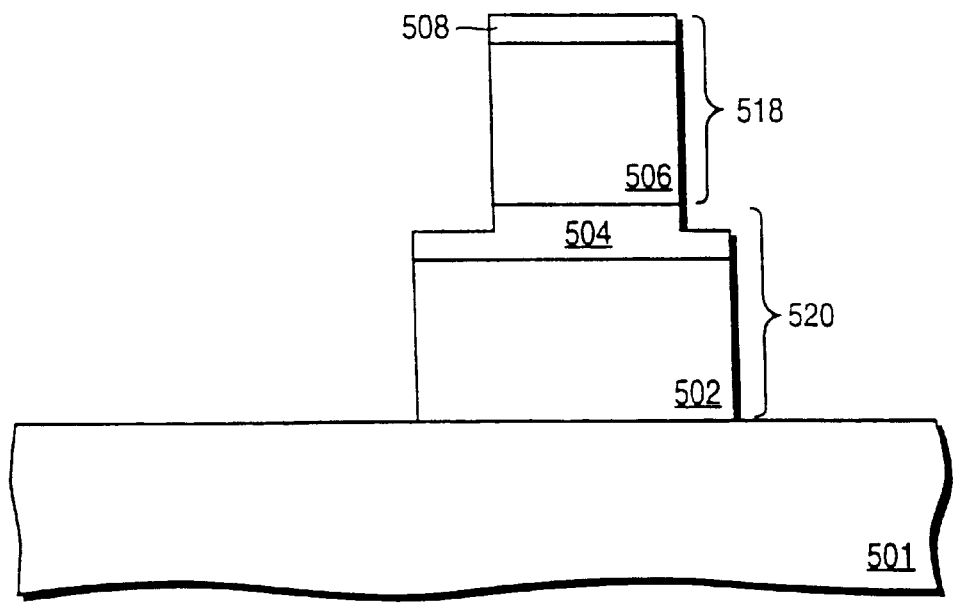

Etch stop layer 504 may be etched using fluorine and conductive material layer 502 is etched using chlorine to produce the structure shown in FIG. 5E when etch stop layer is titanium-tungsten alloy and conductive material layer is aluminum. The chlorine etch stops on substrate layer 501. The result is a conductive material post 520 which is formed below conductive material post 518 that was formed from the earlier etch, as illustrated in FIG. 5C. The result is a multidimensional interconnect to which multiple sites of attachment are possible.

It will be appreciated by those of ordinary skill in the art that the materials used for conductive material layer 502, etch stop layer 504 and substrate layer 501 may be selected in accordance with the etching process and etchant used such that etching of the conductive material layer 502 is conducted in the substantial absence of etching of the substrate layer 501.

Figure 5F:
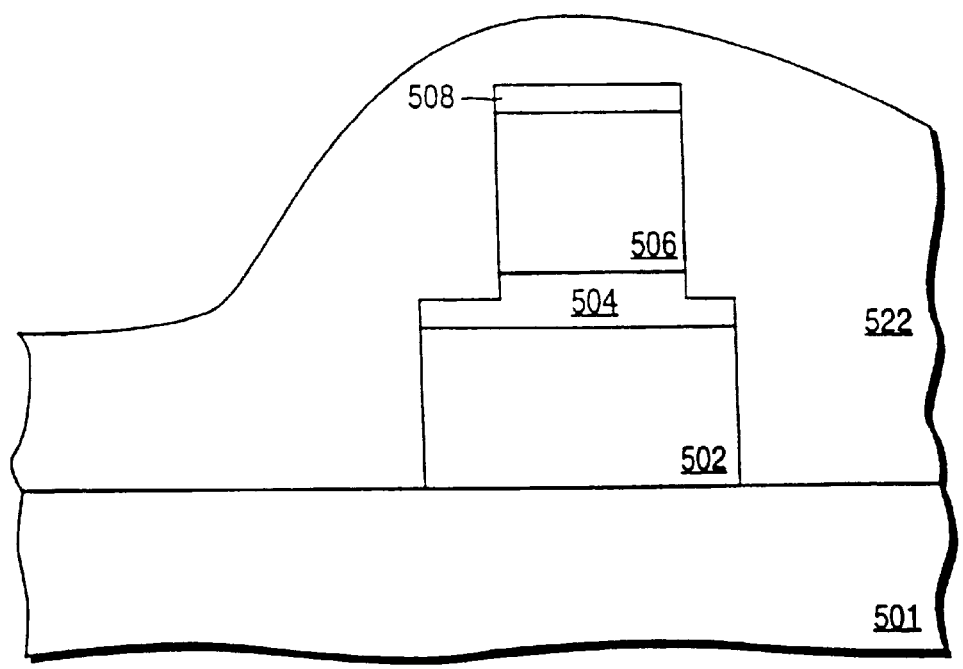
Figure 5G:
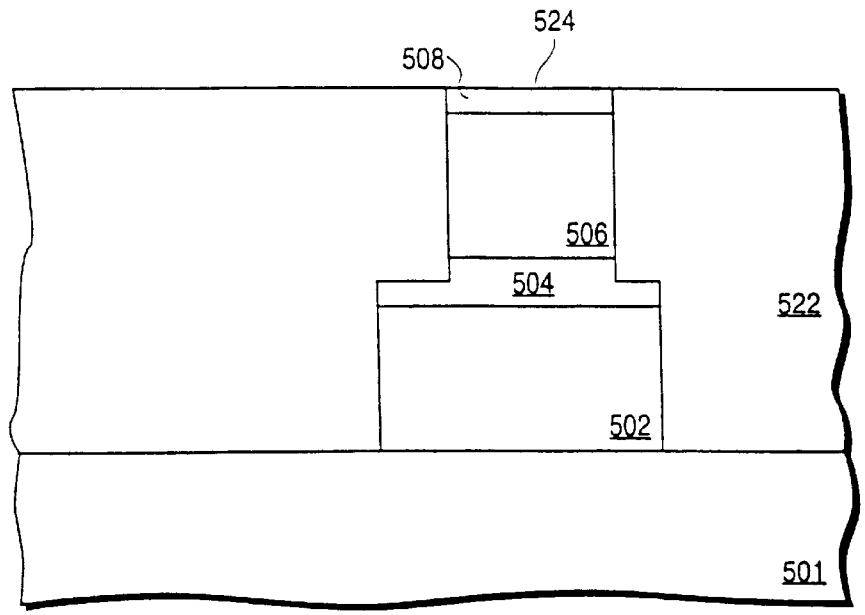
Figure 5H:
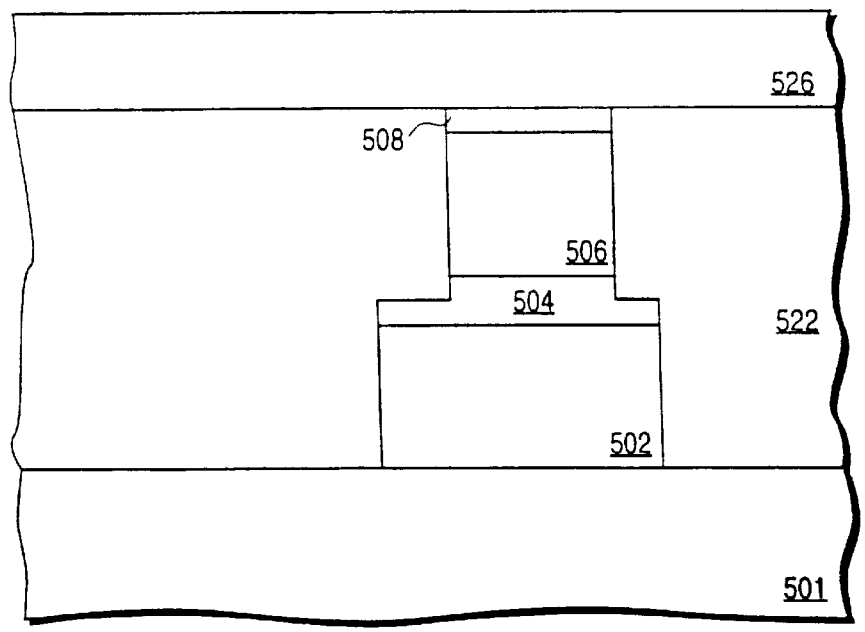

The next step, as illustrated in FIG. 5F, is to deposit an insulating dielectric layer, such as a blanket layer of dielectric 522 over the semiconductor substrate. As illustrated in FIG. 5G, the dielectric 522 is polished or planarized using conventional techniques so that a surface 524 of the top layer of adhesive layer 508 is exposed. It is to be appreciated that this top adhesive layer 508 may be replaced with chromium in a preferred embodiment. In FIG. 5H, a second conductive material layer 526 is deposited over the structure shown in FIG. 5G.

Figure 5I:
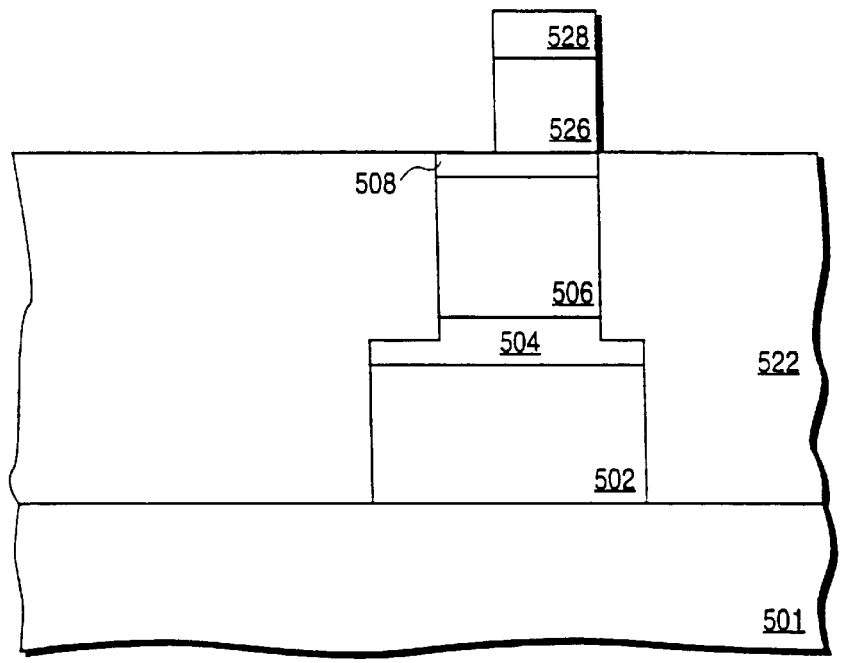
Figure 5J:
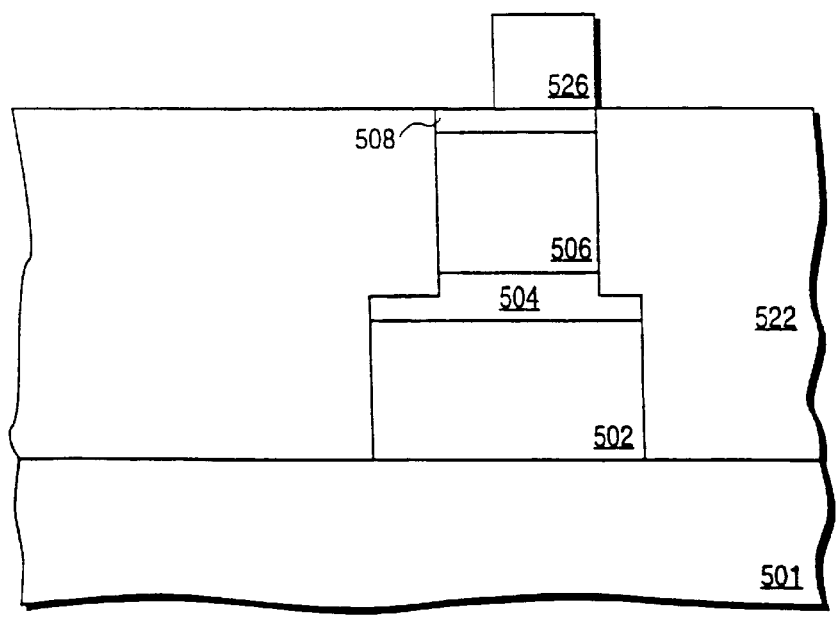

As shown in FIG. 5I, a layer of photoresist 528 has been deposited over the layer of conductive material 526. It is to be appreciated that conductive material 526 is preferably a metal such as aluminum. However, aluminum may be replaced by a different metal or a conductive non-metal. A mask or any other conventional means is used to pattern and develop the photoresist 528 and etch conductive material layer 526 to form a conductive structure, such as an interconnect. Finally in FIG. 5J, the photoresist 528 is stripped and a conductive material structure 526 is formed which can then be used to connect conductive material post 518 and conductive material post 520 to another conductive structure.

It will be appreciated that numerous modifications may be made by one skilled in the art while practicing the present invention without departing from the spirit and scope of the invention. These modifications are within the scope of the present invention and are intended to be covered by the following claims.

What is claimed as new and desired to be secured by Letters Patent of the United States is:

1. A method for forming a contact in an electronic device, comprising the steps of:
    (a) etching a conductive material layer of a structure comprising sequentially: a first insulating layer, said conductive material layer and a photoresist patterned thereon, to remove a sufficient portion of said conductive material not covered by said photoresist, to provide a protruding conductive material structure above said first insulating layer;
    (b) forming a second insulating layer over said first insulating layer and said protruding conductive material structure; and
    (c) planarizing said second insulating layer to expose a portion of said protruding conductive material structure,
    wherein said structure further comprises an etch stop layer between said first insulating layer and said conductive material layer, disposed over and in an opening in said first insulating layer.

2. The method of claim 1, wherein said structure further comprises an adhesive layer between said etch stop layer and said conductive material layer.

3. The method of claim 1, further comprising, after etching of said conductive material, patterning and etching said etch stop layer, to provide a local interconnect.

4. The method of claim 1, further comprising forming a metal layer connected to said exposed portion of said conductive material structure.

5. A method for forming a contact in an electronic device, comprising the steps of:
    a) etching a conductive material layer of a structure comprising sequentially:, a first insulating layer, an etch stop layer, an adhesive layer, said conductive material layer and a photoresist patterned thereon to remove a sufficient portion of said conductive material and said adhesive layer not covered by said photoresist, to provide a protruding conductive material structure above said first insulating layer and said etch stop layer, wherein said etch stop layer is disposed over and in an opening in said first insulating layer;

b) forming a second insulating layer over said first insulating layer and said protruding conductive material structure; and c) planarizing said second insulating layer to expose a portion of said protruding conductive material structure.

6. The method of claim 5, wherein said opening in said first insulating layer leads to a substrate region selected from the group consisting of a source region, a drain region, a gate material of a gate electrode and a local interconnect.

7. The method of claim 5, wherein said etch stop layer is titanium; said adhesive layer is titanium-tungsten alloy and said conductive material layer is tungsten.

8. The method of claim 5, wherein etching of said conductive material is conducted with an etchant selected from the group consisting of $SF_6$, $Cl_2$ and $CCl_4$.

* * * * *